(12) United States Patent
Gardner et al.

(10) Patent No.: US 11,929,253 B2
(45) Date of Patent: Mar. 12, 2024

(54) SAG NANOWIRE GROWTH WITH A PLANARIZATION PROCESS

(71) Applicant: Microsoft Technology Licensing, LLC, Redmond, WA (US)

(72) Inventors: Geoffrey C. Gardner, West Lafayette, IN (US); Sergei V. Gronin, West Lafayette, IN (US); Raymond L. Kallaher, West Lafayette, IN (US); Michael James Manfra, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/887,480

(22) Filed: May 29, 2020

(65) Prior Publication Data

US 2021/0375623 A1    Dec. 2, 2021

(51) Int. Cl.
*H01L 21/00*  (2006.01)
*H01L 21/02*  (2006.01)
*H01L 21/321* (2006.01)

(52) U.S. Cl.
CPC .. *H01L 21/02603* (2013.01); *H01L 21/02304* (2013.01); *H01L 21/3212* (2013.01)

(58) Field of Classification Search
CPC ................ H01L 21/02304; H01L 21/02603
See application file for complete search history.

(56) References Cited

U.S. PATENT DOCUMENTS

| | | | |
|---|---|---|---|
| 6,576,518 B1 | 6/2003 | Yamada et al. | |
| 7,829,416 B2 | 11/2010 | Kudou et al. | |
| 9,472,468 B2 | 10/2016 | van Dal et al. | |
| 10,629,798 B1 | 4/2020 | Kallaher et al. | |
| 10,777,728 B2 | 9/2020 | Aseev et al. | |
| 10,978,632 B2 | 4/2021 | Kallaher et al. | |

(Continued)

FOREIGN PATENT DOCUMENTS

WO    2018125081 A1    7/2018
WO    2019074557 A1    4/2019

OTHER PUBLICATIONS

"Final Office Action Issued in U.S. Appl. No. 16/887,635", dated Dec. 9, 2021, 8 Pages.

(Continued)

*Primary Examiner* — Reema Patel

(74) *Attorney, Agent, or Firm* — Withrow & Terranova, PLLC

(57) ABSTRACT

The present disclosure relates to a method of manufacturing a nanowire structure. According to an exemplary process, a substrate is firstly provided. An intact buffer region is formed over the substrate, and a sacrificial top portion of the intact buffer region is eliminated to provide a buffer layer with a planarized top surface. Herein, the planarized top surface has a vertical roughness below 10 Å. Next, a patterned mask with an opening is formed over the buffer layer, such that a portion of the planarized top surface of the buffer layer is exposed. A nanowire is formed over the exposed portion of the planarized top surface of the buffer layer through the opening of the patterned mask. The buffer layer is configured to have a lattice constant that provides a transition between the lattice constant of the substrate and the lattice constant of the nanowire.

16 Claims, 9 Drawing Sheets

(56) References Cited

U.S. PATENT DOCUMENTS

Figure 1:
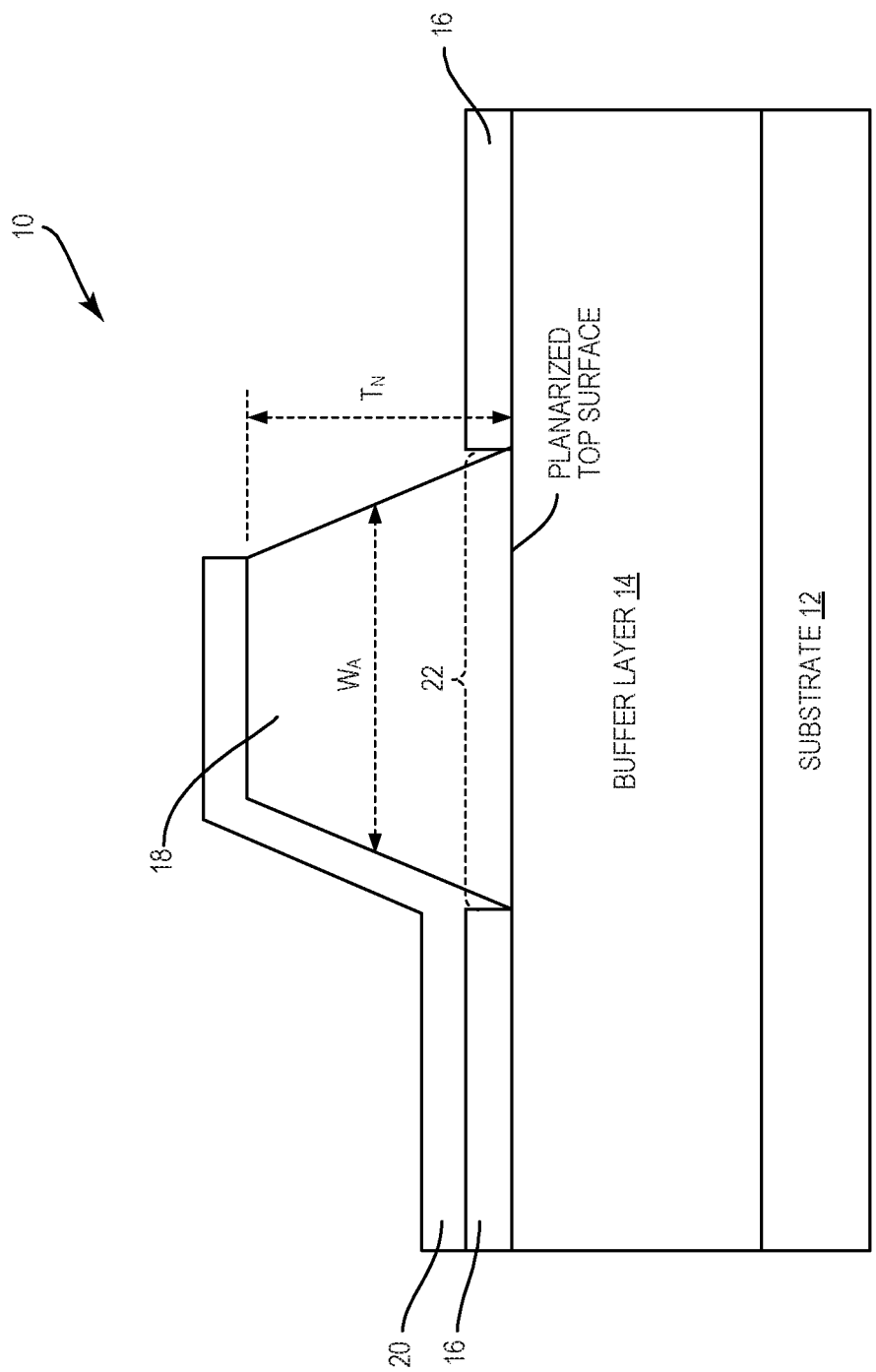

| | | | |
|---|---|---|---|
| 2005/0142804 A1* | 6/2005 | Shin | H01L 21/76232 257/E21.549 |
| 2008/0258132 A1* | 10/2008 | Liu | H01L 33/06 257/14 |
| 2011/0117740 A1* | 5/2011 | Martinez | H01L 21/76254 438/693 |
| 2013/0099283 A1 | 4/2013 | Lin et al. | |
| 2015/0207028 A1* | 7/2015 | Romano | H01L 33/22 438/39 |
| 2015/0228730 A1 | 8/2015 | Yang et al. | |
| 2016/0126322 A1* | 5/2016 | Ye | H01L 21/0262 257/190 |
| 2017/0054021 A1 | 2/2017 | Kunert et al. | |
| 2018/0358436 A1 | 12/2018 | Jambunathan et al. | |
| 2021/0210599 A1 | 7/2021 | Gardner et al. | |
| 2021/0375624 A1 | 12/2021 | Gardner et al. | |
| 2023/0005743 A1 | 1/2023 | Gardner et al. | |

OTHER PUBLICATIONS

Jiao, et al., "Studying of Linearly Graded Buffer Layer Effect on Quality of InGaAs on GaAs Substrate", in 6th International Symposium on Advanced Optical Manufacturing and Testing Technologies: Optoelectronic Materials and Devices for Sensing, Imaging, and Solar Energy, vol. 8419, Oct. 15, 2012, 7 Pages.

"International Search Report and Written Opinion Issued in PCT Application No. PCT/US20/065023", dated Mar. 23, 2021, 32 Pages.

Zhang, et al., "The Effect of Buffer Types on the In0. 82Ga0. 18As Epitaxial Layer Grown on an InP (100) Substrate", in Journal of Materials, vol. 11, Issue 6, Jun. 8, 2018, pp. 1-11.

Non-Final Office Action for U.S. Appl. No. 16/887,635, dated May 28, 2021, 9 pages.

Muessig, B.H. et al., "Selective high-temperature-stable oxygen implantation and MBE-overgrowth technique," Gallium Arsenide and Related Compounds 1993, Proceedings of the 20th International Symposium on Gallium Arsenide and Related Compounds, Frieburg, Germany, Aug. 29-Sep. 2, 1993, Institute of Physics Conference Series No. 136, Institute of Physics Publishing, pp. 529-534.

Pearton, S.J., "Ion Implantation for Isolation of III-V Semiconductors," Materials Science Reports, vol. 4, 1990, pp. 313-363.

"Non Final Office Action Issued in U.S. Appl. No. 16/736,930," dated Oct. 28, 2021, 8 Pages.

"International Search Report and Written Opinion Issued in PCT Application No. PCT/US2021/020464", dated Jun. 16, 2021, 11 Pages.

"International Search Report and Written Opinion Issued in PCT Application No. PCT/US2021/020474", dated Jun. 11, 2021, 24 Pages.

Krishnan, M., et al., "Chemical Mechanical Planarization: Slurry Chemistry, Materials, and Mechanisms," Chemical Reviews, vol. 110, No. 1, 2010, American Chemical Society, pp. 178-204.

Vaitiekenas, S., et al., "Selective Area Grown Semiconductor-Superconductor Hybrids: A Basis for Topological Networks," Physical Review Letters, vol. 121, No. 14, 2018, 8 pages.

Zhou, Y., et al., "Characterization of sapphire chemical mechanical polishing performances using silica with different sizes and their removal mechanisms," Colloids and Surfaces A: Physicochemical and Engineering Aspects, vol. 513, Jan. 2017, Elsevier B.V., pp. 153-159.

"Non Final Office Action Issued in U.S. Appl. No. 16/736,930", dated Apr. 28, 2022, 8 Pages.

"Notice of Allowance Issued in U.S. Appl. No. 16/887,635", dated May 20, 2022, 8 Pages.

"Final Office Action Issued in U.S. Appl. No. 16/887,635", dated Feb. 4, 2022, 8 Pages.

"Final Office Action Issued in U.S. Appl. No. 16/736,930", dated Aug. 1, 2022, 11 Pages.

"Corrected Notice of Allowability Issued in U.S. Appl. No. 16/887,635," dated Aug. 15, 2022, 4 pages.

"Non Final Office Action Issued in U.S. Appl. No. 16/736,930", dated Dec. 20, 2022, 13 Pages.

"Notice of Allowance Issued in U.S. Appl. No. 16/736,930", dated Mar. 29, 2023, 9 Pages.

* cited by examiner

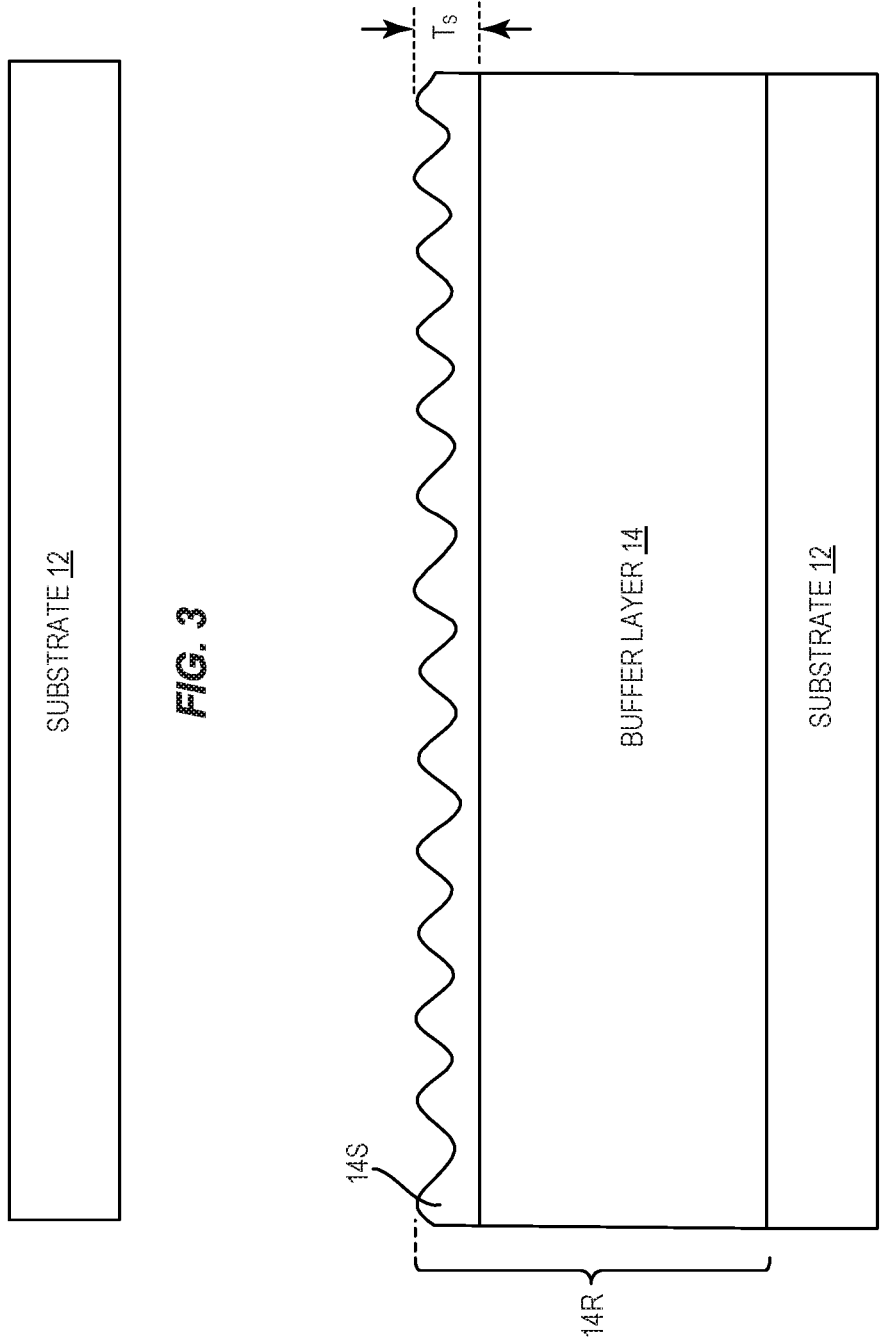

SAG NANOWIRE GROWTH WITH A PLANARIZATION PROCESS

FIELD OF THE DISCLOSURE

The present disclosure relates to a manufacturing process for selective area growth (SAG) nanowire growth, and in particular to a manufacturing process for a SAG nanowire growth with a planarization process of a buffer layer, which reduces defects during the SAG nanowire growth.

BACKGROUND

Nanowires show great promise for applications in quantum computing. Unfortunately, it is difficult to manufacture high quality nanowires. Conventional processes for manufacturing nanowires include selective-area-growth (SAG) wherein nanowires are selectively grown directly on a substrate through a patterned mask. To function properly, nanowires must be a conducting semiconductor material. The substrate on which the nanowires are grown is desired to be an insulating material. To meet this condition, there is often a large difference in the crystal lattice constant of the substrate and the nanowires to be grown via SAG. This crystal lattice mismatch causes crystalline defects in the nanowires during growth such as dislocations and stacking faults. The crystalline defects can penetrate the nanowires and in turn decrease the performance of the resulting nanowires.

In addition, surface smoothness of the nanowires, which enables electrons to move consistently and uniformly within the nanowires, is critical to the quality and functionality of the nanowires. Accordingly, there is a need for manufacturing nanowires with reduced crystalline defects without sacrificing the surface smoothness of the nanowires.

SUMMARY

The present disclosure relates to a method for manufacturing a nanowire structure. According to an exemplary process, a substrate is firstly provided. An intact buffer region is formed over the substrate, and a sacrificial top portion of the intact buffer region is eliminated to provide a buffer layer with a planarized top surface. Herein, the planarized top surface has a vertical roughness below 10 Å. Next, a patterned mask is formed over the planarized top surface of the buffer layer. The patterned mask includes an opening through which a portion of the planarized top surface of the buffer layer is exposed. A nanowire is then formed over the exposed portion of the planarized top surface of the buffer layer through the opening of the patterned mask. The buffer layer is configured to have a lattice constant between a lattice constant of the substrate and a lattice constant of the nanowire, so as to provide a transition between the lattice constant of the substrate and the lattice constant of the nanowire.

In one embodiment of the exemplary process, the planarized top surface of the buffer layer has the vertical roughness below 5 Å.

In one embodiment of the exemplary process, the sacrificial top portion of the intact buffer region is eliminated by a chemical and mechanical polishing (CMP) technique, which includes one or more of chemical etching, oxidizing, surfactant solutions, and mechanical polishing.

In one embodiment of the exemplary process, the sacrificial top portion of the intact buffer region is eliminated by a chemical and mechanical polishing (CMP) technique, which utilizes one or more chemicals including hydrochloric acid, hydrogen peroxide, ammonium dodecyl sulfate and silica nanoparticles.

In one embodiment of the exemplary process, the eliminated sacrificial top portion of the intact buffer region has a thickness between 1 nm and 1000 nm.

In one embodiment of the exemplary process, the lattice constant of the buffer layer gradually varies from the planarized top surface of the buffer layer on the nanowire to a bottom surface of the buffer layer on the substrate.

In one embodiment of the exemplary process, the buffer layer includes a number of discrete layers, each of which is formed of a different material.

In one embodiment of the exemplary process, the substrate is formed of one of indium phosphide, gallium antimonide, and gallium arsenide. The buffer layer includes one or more layers each formed of one or more of indium aluminum arsenide, indium gallium arsenide, and aluminum gallium arsenide antimonide. The nanowire is formed of one of indium arsenide, indium antimonide, and indium arsenide antimonide.

In one embodiment of the exemplary process, the patterned mask is formed of one of silicon dioxide, silicon nitride, aluminum oxide, and diamond.

According to another embodiment, the exemplary process further includes providing a superconductor layer on the nanowire.

In one embodiment of the exemplary process, forming the patterned mask starts with forming a mask layer over the planarized top surface of the buffer layer. Next, a lithography mask with an opening is applied over the mask layer. A portion of the mask layer is eliminated aligning the opening of the lithography mask to form the patterned mask. As such, the opening of the patterned mask is a same size of the opening of the lithography mask, and the portion of the planarized top surface of the buffer layer is exposed. At last, the lithography mask is removed to expose the patterned mask.

In one embodiment of the exemplary process, the intact buffer region is formed by molecular-beam epitaxy (MBE), chemical beam epitaxy (CBE), chemical vapor deposition (CVD), or metal organic chemical vapor deposition (MOCVD).

In one embodiment of the exemplary process, the nanowire is formed by MBE, CBE, or CVD.

The present disclosure also relates to an exemplary nanowire structure, which includes a substrate, a buffer layer, a patterned mask, and a nanowire. The buffer layer with a planarized top surface resides over the substrate. The planarized top surface of the buffer layer has a vertical roughness below 10 Å. The patterned mask with an opening resides over the planarized top surface of the buffer layer, such that a portion of the planarized top surface of the buffer layer is exposed through the opening of the patterned mask. The nanowire resides over the exposed portion of the planarized top surface of the buffer layer through the opening of the patterned mask. Herein, the buffer layer is configured to have a lattice constant between a lattice constant of the substrate and a lattice constant of the nanowire, so as to provide a transition between the lattice constant of the substrate and the lattice constant of the nanowire.

In one embodiment of the nanowire structure, the planarized top surface of the buffer layer has the vertical roughness below 5 Å.

In one embodiment of the nanowire structure, the lattice constant of the buffer layer gradually varies from the planarized top surface of the buffer layer on the nanowire to a bottom surface of the buffer layer on the substrate.

In one embodiment of the nanowire structure, the buffer layer includes a number of discrete layers, each of which is formed of a different material.

In one embodiment of the nanowire structure, the lattice constant of the buffer layer at least partially transitions between the lattice constant of the substrate and the lattice constant of the nanowire.

In one embodiment of the nanowire structure, the lattice constant of a buffer layer completely transitions between the lattice constant of the substrate and the lattice constant of the nanowire.

In one embodiment of the nanowire structure, the substrate is formed of one of indium phosphide, gallium antimonide, and gallium arsenide. The buffer layer includes one or more layers each formed of one or more of indium aluminum arsenide, indium gallium arsenide, and aluminum gallium arsenide antimonide. The nanowire is formed of one of indium arsenide, indium antimonide, and indium arsenide antimonide.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates an exemplary nanowire structure according to one embodiment of the present disclosure.

Figure 2:
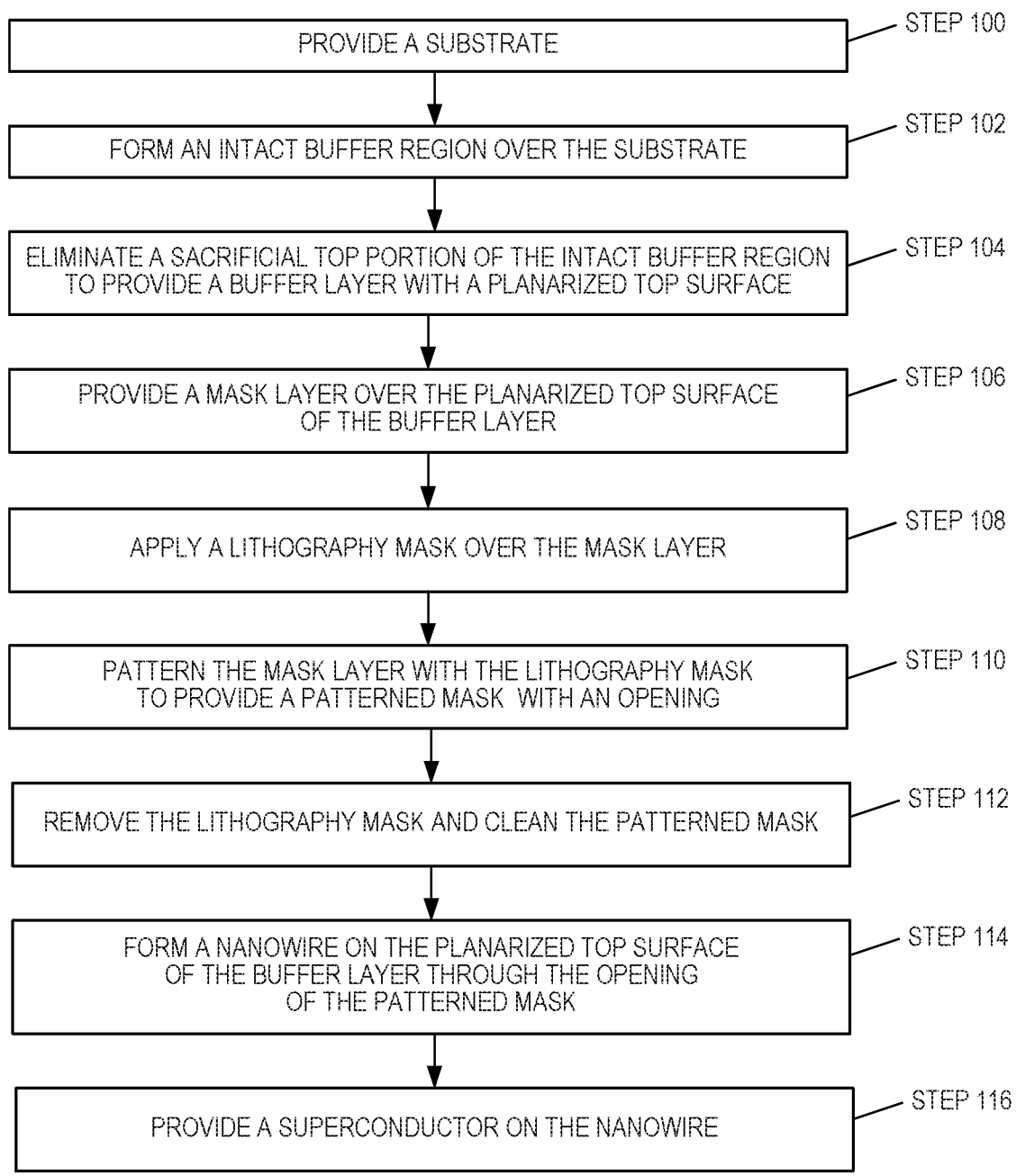

FIG. 2 provides a flow diagram that illustrates an exemplary method for manufacturing a nanowire structure according to one embodiment of the present disclosure.

FIGS. 3-11 illustrate the steps associated with the manufacturing process provided in FIG. 2.

It will be understood that for clear illustrations, FIGS. 1-11 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein FIG. 1 shows a cross section view of a nanowire structure 10 according to one embodiment of the present disclosure. The nanowire structure 10 includes a substrate 12, a buffer layer 14, a patterned mask 16, a nanowire 18, and a superconductor 20. The buffer layer 14 resides over the substrate 12 and the patterned mask 16 resides over the buffer layer 14. The patterned mask 16 includes an opening 22 through which a portion of a top surface of the buffer layer 14 is exposed. The nanowire 18 resides over the exposed portion of the top surface of the buffer layer 14 through the opening 22 of the patterned mask 16. The superconductor 20 resides over the nanowire 18 and optionally over a portion of the patterned mask 16. In different applications, the nanowire structure 10 may include two or more nanowires 18, and the patterned mask 16 may include two or more openings 22 to expose two or more portions of the top surface of the buffer layer 14. Each nanowire 18 resides over a corresponding portion of the top surface of the buffer layer 14 through a corresponding opening 22 of the patterned mask 16 (not shown). For clarity and simplicity, only one nanowire 18 is illustrated in the following disclosure.

The substrate 12 may be formed of an insulator, such as silicon (Si), indium phosphide (InP), gallium phosphide (GaP), gallium antimonide (GaSb), or gallium arsenide (GaAs). The substrate 12 may have a thickness between 50 μm and 1000 μm. The patterned mask 16 may be formed of a dielectric material such as silicon dioxide ($SiO_2$), silicon nitride (SiN), aluminum oxide ($Al_2O_3$), diamond, or the like. The nanowire 18 is an elongate member that has a nano-scale width and a length-to-width ratio of at least 10, or at least 20 (length of the nanowire 18, having a direction perpendicular to the cross section view, is not shown), and is grown selectively on the buffer layer 14 through the patterned mask 16. A non-limiting example of the nanowire 18 has an average width ($W_A$) in the range of 10 to 1000 nm, optionally 50 to 100 nm or 75 to 125 nm. The length of the nanowire 18 may be of the order of micrometers, e.g. at least 1 μm, or at least 10 μm. In addition, a thickness ($T_N$) of the nanowire 18 may be between 20 nm and 300 nm. The nanowire 18 may be formed of a conductive semiconductor such as indium arsenide (InAs), indium antimonide (InSb), or indium arsenide antimonide (InAsSb). The superconductor 20 may be formed of aluminum (Al), lead (Pb), niobium indium (NbIn), tin (Sn), or vanadium (V), with a thickness between 3 nm and 30 nm.

Since conducting semiconductors and insulators generally have very different lattice constants, a high lattice mismatch may occur between the nanowire 18 and the substrate 12 when the nanowire 18 is provided directly on the substrate 12. As a result, the nanowire 18 may not function properly. To solve this problem, the buffer layer 14 is provided between the substrate 12 and the nanowire 18. The buffer layer 14 may have a lattice constant between the lattice constant of the substrate 12 and the lattice constant of the nanowire 18, so as to provide a transition between the lattice constant of the substrate 12 and the lattice constant of the nanowire 18 over a thickness of the buffer layer 14. The buffer layer 14 may provide a partial transition between the lattice constant of the substrate 12 and the lattice constant of the nanowire 18 or a complete transition between the lattice constant of the substrate 12 and the lattice constant of the nanowire 18.

In one embodiment, the lattice constant of the buffer layer 14 may gradually vary from the top surface of the buffer layer 14 on the nanowire 18 to a bottom surface of the buffer layer 14 on the substrate 12. To achieve a graded lattice constant, the buffer layer 14 may include multiple discrete layers (not shown), each of which may be formed of a different material with a same or different thickness. Herein and hereafter, the "different material" is referred to a material including different ingredients, or a material including same ingredients with different concentrations. For instance, indium aluminum arsenide (InAlAs) and indium aluminum antimonide (InAlSb) are different materials, and $In_{0.52}Al_{0.48}As$ and $In_{0.89}Al_{0.11}As$ are also different materials. Due to the different material, each layer of the buffer layer 14 may have a different lattice constant, so as to form the graded lattice constant in the buffer layer 14. In some applications, the lattice constant of the buffer layer 14 may gradually decrease from the top surface of the buffer layer 14 on the nanowire 18 to the bottom surface of the buffer layer 14 on the substrate 12. In various embodiments, the buffer layer 14 may include one or more layers of InAlAs, InAlSb, indium gallium arsenide (InGaAs), indium gallium phosphide (InGaP), indium aluminum arsenide antimonide (InAlAsSb), indium gallium aluminum antimonide (InGaAlSb), aluminum gallium arsenide antimonide (AlGaAsSb), and indium gallium arsenide antimonide (InGaAsSb), with possible ingredient concentrations for each of these materials. The buffer layer 14 is desired to be electrically insulating.

The buffer layer 14 provides a better lattice match for the nanowire 18 than the substrate 12. Accordingly, defects such as misfit dislocations, slip planes, and stacking faults can be reduced or eliminated. Further, other desirable properties, such as electrical confinement and insulation, can be maintained by selecting the appropriate material for the buffer layer 14. The buffer layer 14 may have a thickness between 100 nm and 50000 nm. The buffer layer 14 is not limited in its thickness, and thus can provide a much larger transition in lattice constant while maintaining other desirable characteristics of the substrate 12 such as electrical insulation. The present disclosure contemplates any and all permutations and combinations of the above mentioned materials and thicknesses for the substrate 12, the buffer layer 14, the patterned mask 16, the nanowire 18, and the superconductor 20.

In one exemplary embodiment, the substrate 12 is In P, and has a thickness of 350 μm. The buffer layer 14 includes several layers, including a first layer of $In_{0.52}Al_{0.48}As$ having a thickness of 100 nm on the substrate 12, a second layer of $In_{0.53}Ga_{0.47}As$ having a thickness of 2.5 nm on the first layer, a third layer of $In_{0.52}Al_{0.48}As$ having a thickness of 2.5 nm on the second layer, a fourth layer on the third layer, the fourth layer transitioning from $In_{0.52}Al_{0.48}As$ to $In_{0.89}Al_{0.11}As$ over a thickness of 1000 nm, for example, as 20 discrete layers having a thickness of 50 nm, a fifth layer of $InAl_{0.20}As$ having a thickness of 33 nm on the fourth layer, a sixth layer of $InAl_{0.20}As$ having a thickness of 25 nm on the fifth layer, a seventh layer of $InGa_{0.20}As$ having a thickness of 20 nm on the sixth layer, and an eighth layer of $InGa_{0.30}As$ having a thickness of 17 nm on the seventh layer. The nanowire 18 is InAs on the eighth layer of the buffer layer 14. The various layers of the buffer layer 14 provide a transition in lattice constant between the substrate 12 and the nanowire 18. Notably, the particular configuration of the buffer layer 14, including the number of layers, the thickness of each layer, and the material composition of each layer are merely exemplary and are not intended to limit the scope of the present disclosure in any way.

In another exemplary embodiment, the substrate 12 is GaSb and has a thickness of 350 μm. The buffer layer 14 includes a first layer of GaSb having a thickness of 500 nm, a second layer of $Al_{0.8}Ga_{0.2}As_{0.07}Sb_{0.93}$ having a thickness of 50 nm on the first layer, and a third layer of InGaAs having a thickness of 2 monolayers (ML) on the second layer. The nanowire 18 is InAs having a thickness of 150 nm. Those skilled in the art will appreciate that GaSb has a lattice constant that is relatively close to that of InAs. However, other properties (e.g., electrical confinement and isolation) of GaSb may not be ideal as a platform for the nanowire 18. The buffer layer 14 may thus primarily be provided in this embodiment to provide one or more other desirable properties (e.g., electrical confinement and isolation), rather than for lattice matching.

In quantum computing, the nanowires are utilized to host and transmit quantum states emerging from the electrons in the structure, which are desired to move consistently and uniformly. Therefore, each surface of the nanowire 18 is desired to be smooth to decrease scattering of the electrons. Since the nanowire 18 is formed over the top surface of the buffer layer 14 (more details described below), the top surface of the buffer layer 14 is required to be a planarized surface. The "planarized surface" as referred to herein is a surface with a vertical roughness below 10 Å, or desirably below 5 Å.

FIG. 2 provides a flow diagram that illustrates a method for manufacturing the nanowire structure 10 according to one embodiment of the present disclosure. FIGS. 3-11 illustrate the steps associated with the manufacturing process provided in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3-11.

Initially, the substrate 12 is provided as depicted in FIG. 3 (step 100). The substrate 12 may be formed of an insulator, such as Si, InP, GaP, GaSb, or GaAs. The substrate 12 may have a thickness between 50 μm and 1000 μm. An intact buffer region 14R is formed over the substrate 12 as depicted in FIG. 4 (step 102). The intact buffer region 14R may be over an entire surface of the substrate 12. The intact buffer region 14R may be provided by any suitable manufacturing process, such as molecular-beam epitaxy (MBE), chemical beam epitaxy (CBE), chemical vapor deposition (CVD), or metal organic chemical vapor deposition (MOCVD). The intact buffer region 14R may include multiple discrete layers, each of which may be formed of a different material with a same or different thickness. In various embodiments, the intact buffer region 14R may include one or more layers (not shown) of InAlAs, InAlSb, InGaAs, InGaP, InAlAsSb, InGaAlSb, AlGaAsSb, and InGaAsSb, with possible ingredient concentrations for each of these materials. In one embodiment, a configuration of the intact buffer region 14R makes a lattice constant within the intact buffer region 14R gradually increase from bottom (next to the substrate 12) to top. Typically, growth of the intact buffer region 14R over the substrate 12 cannot be ended with a perfect planar surface. Instead, as illustrated in FIG. 4, the intact buffer region 14R has an uneven top surface due to strain effects (stretching or shrinking) of the lattice constant during growth. The uneven top surface of the intact buffer region 14R is undesirable for nanowire growth. If the nanowire 18 is grown over the uneven top surface of the intact buffer region 14R, the nanowire 18 will result in an uneven bottom surface contacting the uneven top surface of the intact buffer region 14R. Consequently, the nanowire 18 cannot transmit the electrons consistently and uniformly.

Figure 5:
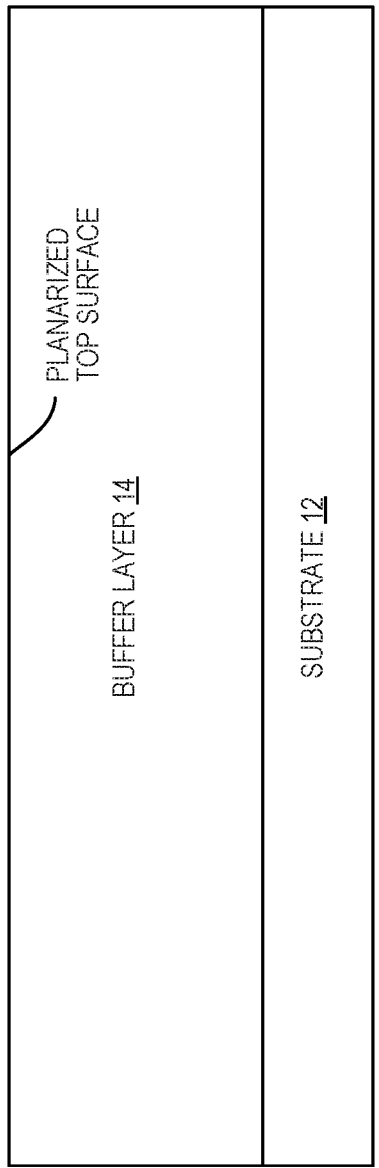

To eliminate the uneven top surface of the intact buffer region 14R, a planarization process is introduced. The planarization process, which may be implemented by a chemical and mechanical polishing (CMP) technique, eliminates a sacrificial top portion 14S (with the uneven top surface) of the intact buffer region 14R to provide the buffer layer 14 with the planarized top surface (step 104) as depicted in FIG. 5. Herein, the planarized top surface of the buffer layer 14 has a vertical roughness below 10 Å or desirably below 5 Å. The bottom surface of the buffer layer 14 is the bottom surface of the intact buffer region 14R. In a non-limiting example, the CMP techniques used for planarization may include one or more of chemical etching, oxidizing, surfactant solutions, and mechanical polishing. In addition, the CMP techniques may utilize one or more chemicals including hydrochloric acid, hydrogen peroxide, ammonium dodecyl sulfate, and silica nanoparticles. Due to different CMP techniques with different polishing parameters, the sacrificial top portion 14S removed from the intact buffer region 14R may have a different thickness between 1 nm and 1000 nm. For instance, when the planarization process utilizes $HCl/H_2O_2$+ammonium dodecyl sulfate (ADS) and silica nanoparticles, the removed sacrificial top portion 14S may have a thickness between 1 nm and 100 nm. Etching rates are typically in nm/min range. When the planarization process utilizes carboxylic acids and Ceria nanoparticles, the removed sacrificial top portion 14S may have a thickness between 1 nm and 100 nm. In one embodiment, the sacrificial top portion 14S may be designed to include only one material and the lattice constant at the planarized top surface of the buffer layer 14 may be the same as the lattice constant at the uneven top surface of the intact buffer region 14R.

With reference to FIGS. 6 through 9, the patterned mask 16 is formed over the planarized top surface of the buffer layer 14 (steps 106-112) according to one embodiment of the present disclosure. Although the steps for the patterned mask 16 are illustrated in a series, these steps are not necessarily order dependent. Some steps may be done in a different order than that presented. Further, the steps for the patterned mask 16 within the scope of this disclosure may include fewer or more steps than those illustrated in FIGS. 6-9.

Figure 6:
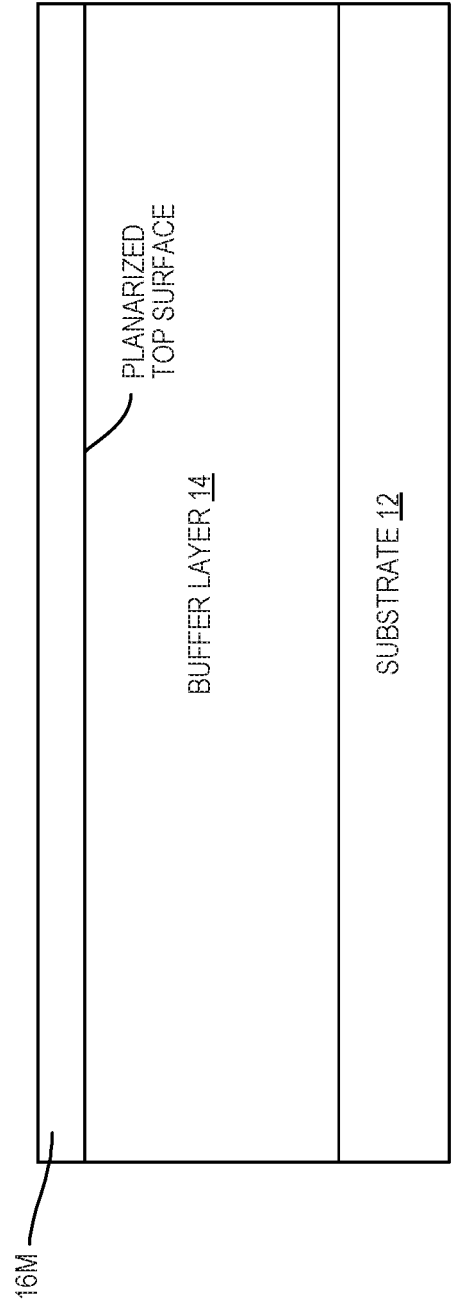
Figure 7:
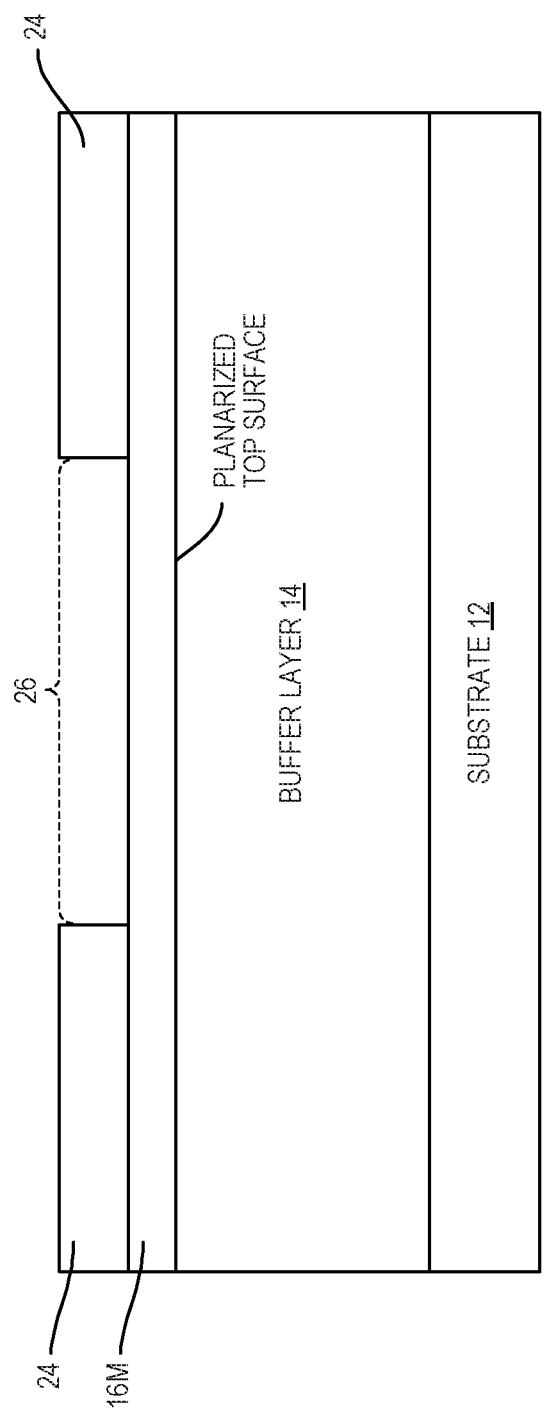
Figure 8:
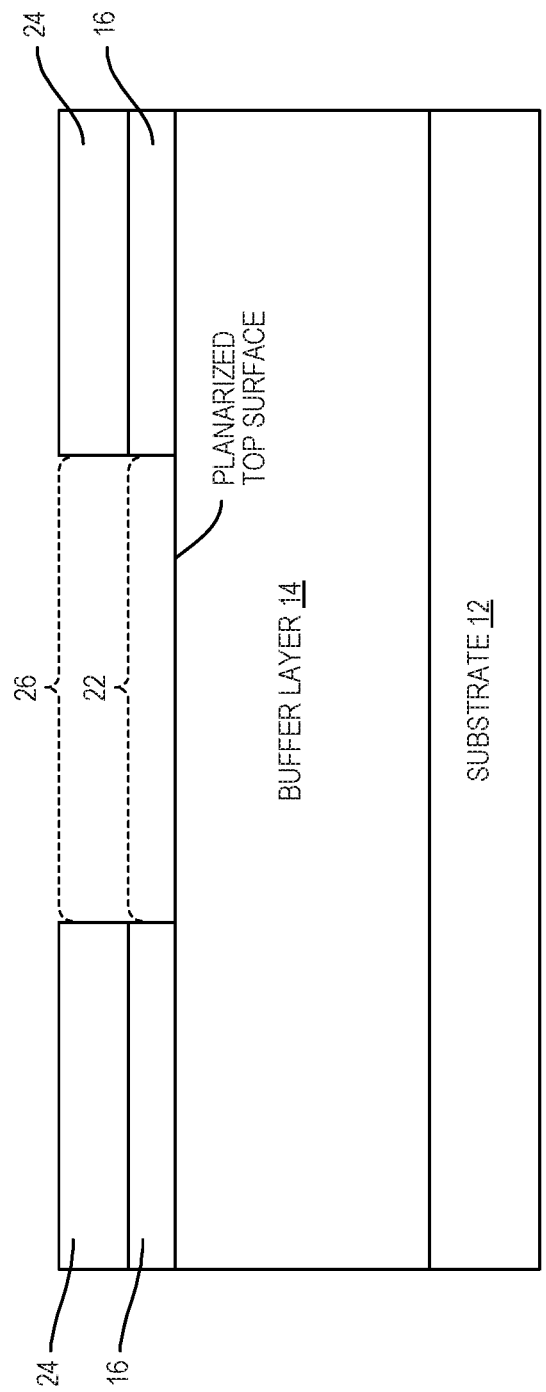
Figure 9:
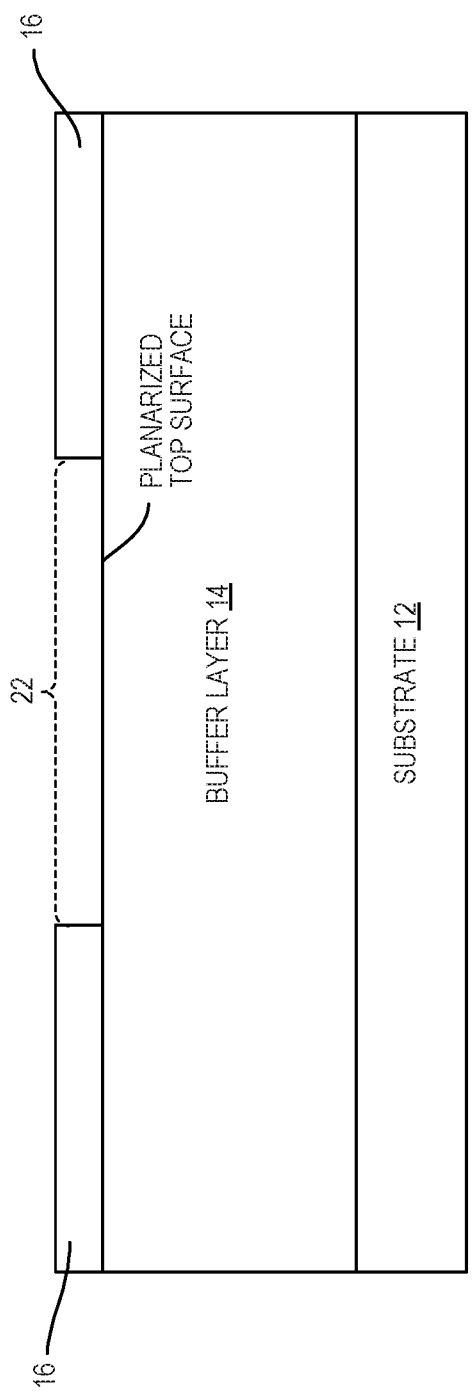

A mask layer 16M is firstly provided over the planarized top surface of the buffer layer 14 (step 106), as illustrated in FIG. 6. The mask layer 16M may be formed of a dielectric material such as $SiO_2$, SiN, $Al_2O_3$, diamond or any material which inhibits proper epitaxial growth and maintains selectivity. The mask layer 16M may have a thickness between 2 nm and 1000 nm. Next, a lithography mask 24 with an opening 26 is applied over the mask layer 16M (step 108), as illustrated in FIG. 7. The opening 26 of the lithography mask 24 is designed to fit the nanowire 18. If there are two or more nanowires 18 desired, the lithography mask 24 may be designed to include two or more corresponding openings 26 (not shown). A patterning step is followed to provide the patterned mask 16 based on the lithography mask 24 (step 110), as illustrated in FIG. 8. Herein, a portion of the mask layer 16M is eliminated aligning the opening 26 of the lithography mask 24 to form the patterned mask 16 with the opening 22. As such, the opening 22 of the patterned mask 16 is the same size as the opening 26 of the lithography mask 24, and the planarized top surface of the buffer layer 14 is exposed. The lithography mask 24 is then removed and the patterned mask 16 is cleaned (step 112), as illustrated in FIG. 9.

Figure 10:
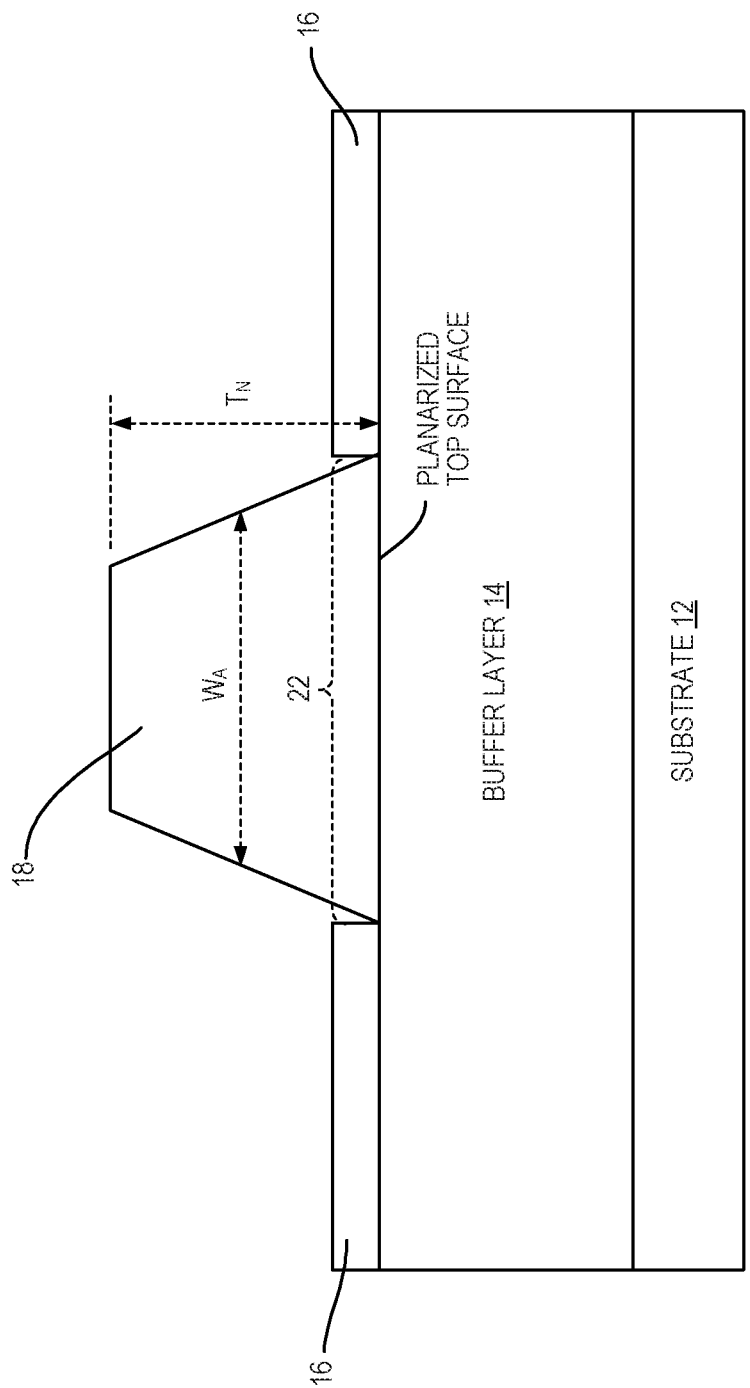
Figure 11:
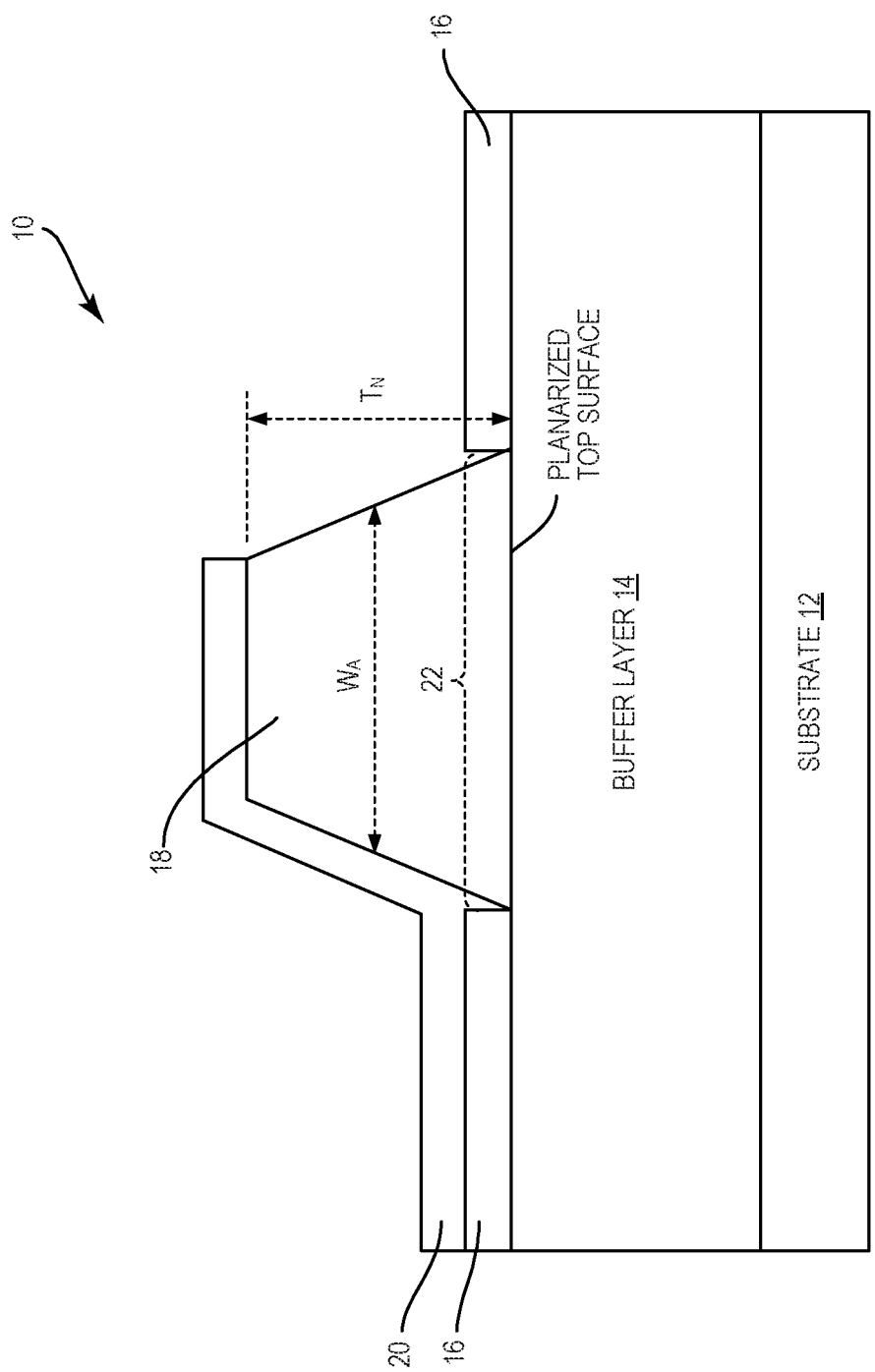

After the patterned mask 16 is formed, the nanowire 18 is grown over the top surface of the buffer layer 14 through the opening 22 of the patterned mask 16 (step 114), as illustrated in FIG. 10. Since the top surface of the buffer layer 14 is planarized, the formed nanowire 18 is eligible to have a smooth and flat bottom surface in contact with the planarized top surface of the buffer layer 14. Consequently, the nanowire 18 may transmit electrons consistently and uniformly. The nanowire 18 may be formed by MBE, CBE, or CVD process, or any other suitable manufacturing process. Lastly, the superconductor 20 is provided on the nanowire 18 (step 116) and, optionally, on a portion of the patterned mask 16, as illustrated in FIG. 11.

Those skilled in the art will recognize improvements and modifications to the preferred embodiments of the present disclosure. All such improvements and modifications are considered within the scope of the concepts disclosed herein and the claims that follow.

What is claimed is:

1. A method for manufacturing a nanowire structure comprising:

providing a substrate;

forming a buffer region over the substrate;

eliminating a sacrificial top portion of the buffer region to provide a buffer layer with a planarized top surface, wherein:

the planarized top surface has a surface roughness below 10 Å; and the buffer layer comprises a plurality of discrete layers;

forming a patterned mask over the planarized top surface of the buffer layer, wherein the patterned mask comprises an opening through which a portion of the planarized top surface of the buffer layer is exposed; and forming a nanowire after the patterned mask is formed, wherein the nanowire is formed over the exposed portion of the planarized top surface of the buffer layer through the opening of the patterned mask, and the nanowire protrudes vertically beyond a top surface of the patterned mask, wherein:

the substrate comprises indium phosphide;

the nanowire comprises indium arsenide; and within the buffer layer, certain ones of the plurality of discrete layers comprise indium aluminum arsenide with variations in both indium concentration and aluminum concentration, and at least another one of the plurality of discrete layers comprises indium gallium arsenide.

2. The method of claim 1 wherein the planarized top surface of the buffer layer has the surface roughness below 5 Å.

3. The method of claim 1 wherein the sacrificial top portion of the buffer region is eliminated by a chemical and mechanical polishing (CMP) technique, which includes one or more of a group consisting of chemical etching, oxidizing, surfactant solutions, and mechanical polishing.

4. The method of claim 1 wherein the sacrificial top portion of the buffer region is eliminated by a chemical and mechanical polishing (CMP) technique, which utilizes one or more chemicals including at least one of a group of hydrochloric acid, hydrogen peroxide, ammonium dodecyl sulfate and silica nanoparticles.

5. The method of claim 1 wherein the eliminated sacrificial top portion of the buffer region has a thickness between 1 nm and 1000 nm.

6. The method of claim 1 wherein a lattice constant of the buffer layer monotonically varies from the planarized top surface of the buffer layer on the nanowire to a bottom surface of the buffer layer on the substrate.

7. The method of claim 1 wherein each of the plurality of discrete layers within the buffer layer is formed of a different material.

8. The method of claim 1 wherein the patterned mask is formed of one of a group of silicon dioxide, silicon nitride, aluminum oxide, and diamond.

9. The method of claim 1 further comprising providing a superconductor layer on the nano wire.

10. The method of claim 1 wherein forming the patterned mask comprises:

forming a mask layer over the planarized top surface of the buffer layer;

applying a lithography mask with an opening over the mask layer;

eliminating a portion of the mask layer aligning the opening of the lithography mask to form the patterned mask, such that the opening of the patterned mask is a same size of the opening of the lithography mask, and the portion of the planarized top surface of the buffer layer is exposed; and removing the lithography mask to expose the patterned mask.

11. The method of claim 1 wherein the buffer region is formed by molecular-beam epitaxy (MBE), chemical beam epitaxy (CBE), chemical vapor deposition (CVD), or metal organic chemical vapor deposition (MOCVD).

12. The method of claim 1 wherein the nanowire is formed by MBE, CBE, or CVD.

13. The method of claim 1 wherein:

the indium concentration of indium aluminum arsenide included in the certain ones of the plurality of discrete layers varies between 0.52 and 0.89; and the aluminum concentration of indium aluminum arsenide included in the certain ones of the plurality of discrete layers varies between 0.11 and 0.48.

14. The method of claim 1 wherein two or more layers of the plurality of discrete layers comprise indium gallium arsenide with a gallium concentration varying between 0.2 and 0.3.

15. The method of claim 1 wherein:

the certain ones of the plurality of discrete layers, which comprise indium aluminum arsenide with variations in both indium concentration and aluminum concentration, are formed over the substrate; and the at least another one of the plurality of discrete layers, which comprises indium gallium arsenide, is formed over the certain ones of the plurality of discrete layers; and the nanowire is formed over the at least another one of the plurality of discrete layers.

16. The method of claim 1 wherein:

the substrate has a thickness between 50 µm and 1000 µm;

the buffer layer has a thickness between 100 nm and 50000 nm; and the nanowire has a thickness between 20 nm and 300 nm.

* * * * *